United States Patent
Rodgers et al.

(10) Patent No.: US 8,314,612 B1
(45) Date of Patent: Nov. 20, 2012

(54) COMPACT NARROW BAND IMAGING SYSTEM

(76) Inventors: Wayne Eugene Rodgers, Apple Valley, CA (US); Lawrence Scott Ring, Valencia, CA (US)

(*) Notice: Subject to any disclaimer, the term of this patent is extended or adjusted under 35 U.S.C. 154(b) by 1350 days.

(21) Appl. No.: 12/008,595

(22) Filed: Jan. 11, 2008

(51) Int. Cl.
*G01R 33/032* (2006.01)
*G02B 5/30* (2006.01)

(52) U.S. Cl. ............ 324/244.1; 359/484.01; 359/484.03

(58) Field of Classification Search ............... 324/244.1; 359/483.01, 484.01–484.03, 507–508, 513
See application file for complete search history.

(56) References Cited

U.S. PATENT DOCUMENTS

| 5,731,585 | A | 3/1998 | Menders et al. |
| 7,058,110 | B2 | 6/2006 | Zhao et al. |
| 2007/0017281 | A1 | 1/2007 | Rodgers et al. |

OTHER PUBLICATIONS

H. Lin and J.R. Kuhn, An Imaging, Tunable Magneto-Optical Filter, Solar Physics, 1989, pp. 365-380, vol. 122, KKluwer Academic Publisher, Belgium.

*Primary Examiner* — Bot Ledynh (57) ABSTRACT

A compact narrow band imaging system includes a vapor cell having a gas that receives and transmits light in accordance with the Faraday effect. A magnetic source is provided for applying a magnetic field to the vapor cell. Crossed polarizers are disposed before and after the vapor cell creating a Faraday optical filter. The only light that passes through the filter is light within a narrow band near the absorption peaks of the vapor. Other optical elements of the imaging system including filters, image detectors, electron multipliers, signal digitizers, and heat filters are co-located within the imaging system's common thermal isolation container to provide improved performance. The compact system is suitable for wide area surveillance, including daylight surveillance for combustion sources such as forest fires and missile exhaust.

30 Claims, 5 Drawing Sheets

COMPACT NARROW BAND IMAGING SYSTEM

BACKGROUND OF THE INVENTION

1. Field of the Invention

The present invention relates to narrowband imaging apparatus or systems, and in particular to compact, light weight imaging apparatus or systems suitable for detecting from a mobile platform optical emissions from combustion in the presence of daylight.

2. Brief Description of Prior Art

Threats to human life and property are often harkened by combustion. For example, small fires in the wilderness can become forest fires that spread to populated areas. Anti-aircraft missiles sent aloft by burning rocket fuel when launched by terrorists or enemy combatants often target civilian and military aircraft. At night, such combustion sources are readily detected by the light emitted. However, during daytime hours the detection presents a much greater challenge. This is because imaging sensors may be overwhelmed by daylight, including direct sunlight, sunlight scattered from the sky and clouds, and sunlight reflected from objects on the ground or in the air.

Daylight can also overwhelm imaging sensors used for viewing the health of crops, those used for LIDAR (Light Detection and Ranging), FLIR (Forward Looking InfraRed) systems, and laser communications receivers. Other relevant applications where extraneous light can overwhelm imaging sensors include welding observation, specialized cellular microscopy, and solar astronomy.

It is common practice in the art to use infrared (IR) image detectors to detect thermal emission from threat sources at electromagnetic wavelengths longer than those of visible light. The IR detectors used in such applications are expensive. Thus few private and commercial vehicles or aircraft are equipped with IR imaging threat detection systems. In addition, processing IR images to determine what sources are of interest is complex. It demands great processing power to reject clutter and various signal signatures that are not of interest. The cost of these powerful processors adds to the cost of a system based on an IR detector. The detectors and extensive processing lead to increased cost, size and weight of systems that rely on IR imagers.

Atomic Line Filters with passbands of <0.01 nm have been developed as an alternative method for improving the background light rejection of daylight image detectors. Faraday filters based on the Faraday effect are one type of atomic line filter used for this purpose. The Faraday effect refers to the rotation of polarized light when it passes through a medium in the direction of an applied magnetic field. The amount of rotation is proportional to the magnetic field strength and to the distance the light travels through the medium. Faraday filters are also known as Magneto-optical filters (MOF) for this reason. When the medium is an atomic vapor that effect occurs over a very narrow range of frequencies. This effect has been used to make narrow band filters for many years by directing a light beam along the axis of a cell containing an alkali metal vapor. Crossed polarizers are provided at opposite ends of the cell to prevent the passage of almost all light except light with frequencies near the atomic transitions. A magnetic field is applied along the axis of the light beam to rotate the polarization of the light at the transition wavelengths by 90° allowing it to pass through the second polarizer. Most useful for the rejection of background sunlight are Atomic Line Filters centered at the Sun's Fraunhofer Lines. The Fraunhofer lines are narrow minima in the spectrum of light from the sun, produced by absorption of light in the cooler regions of the sun's outer atmosphere at wavelengths corresponding to the atomic and molecular transitions of materials in these regions. Detection of optical emissions from combustion processes on Earth is facilitated at Fraunhofer line wavelengths because there is much less background light. In particular the light intensity within the Sun's Fraunhofer line is often only a few percent of the intensity outside the line. For example, Fraunhofer lines associated with a Solar Potassium absorption occur at 766.4 and 769.9 nm, have a width of about 0.02 nm, and have a central intensity about 80% lower than outside the lines.

On the other hand, combustion optical emissions contain intense narrow-band emissions that are formed by atomic and molecular optical transitions excited as part of the combustion process. They can occur throughout the optical spectrum. Terrestrial events of interest often include combustion of trace amounts of potassium that emit light at 766.4 nm and 769.9 nm. The combustion signal is therefore high and background sunlight signals are low, thus the contrast between combustion emission signal and ambient light is high at the Fraunhofer wavelengths. Combustion detection is therefore more favorable in the wavelengths band of Fraunhofer lines, and particularly in the band of 766.4 nm and 769.9 nm.

To take advantage of the detectability of this terrestrial combustion signal, a narrowband optical filter is needed that stops sunlight in other bands and passes light in a band about 0.01 nm wide that overlaps the potassium emissions at about 766.4 nm or 769.9 nm, or both.

Available MOF filters fall into two classes—cold cell and hot cell. The cold cell filters produce metal vapor by heating some central part of the cell and use a buffer gas to maintain a sufficient vapor population in the central part of the cell without allowing excessive diffusion of the vapor to the end windows. The hot cell filters heat the whole cell in an oven, using a cold finger to control vapor density. The cold-cell MOFs, have a limited field-of-view, are bulky and need continuous calibration to guarantee long-term stability. While prior implementations of the hot-cell MOF can have a moderate field-of-view, they are difficult to construct in a way that minimizes polarization-inducing stresses in the cell windows and oven enclosure windows. Furthermore, the hot cell filters require bulky ovens to maintain cell temperature and control vapor density. Thus, conventional MOF implementations have a limited usefulness for monitoring large sections of Earth or sky for fires, gunfire, missiles and other important combustion events. Especially on aircraft, the total volume and weight available for a combustion monitoring system, such as a missile warning system, is limited. A large array of narrow field of view cold cell MOFs, or hot-cell MOFs with bulky ovens are simply not feasible on an aircraft. Exemplary aircraft constraints for a combustion monitoring system are a volume no larger than about 10 centimeters (cm, 1 cm=10.sup.-2 meters) by 10 cm by 10 cm (i.e., a volume less than 1000 cubic cm) and a mass no greater than 1 kilogram (kg, 1 kg=1000 grams).

Prior art MOF systems capture signals using a camera or other detector external to the MOF and its container. An exit aperture window or windows are used to transmit the image to the external camera or other detector. Optical losses encountered at these windows and within the external camera's optics are a factor in the system detection limits. The mounts and support structure for the camera or other detector add weight and size to the combined MOF imaging system.

The highest performance prior art MOF imaging systems utilize state of the art cooled detectors and image intensifiers. These detectors produce extremely low electronic noise allowing near single photon counting performance. The housings for these detectors must incorporate thermal, environmental, and optical features that add weight, power consumption, size, and optical losses to the prior art MOF imaging system.

Where threats such as incoming missiles are captured by an MOF detector system it is crucial that the captured signal be recognized as a threat quickly, often within milliseconds, if effective counter-measures are to be deployed. Currently envisioned MOF systems utilize high-speed signal processing computers external to the MOF imaging camera for this recognition. The highest performance signal processing computer chips are often cooled to obtain lower noise. At the speeds required for threat detection even the signal delays caused by wire lead lengths between the detector and the signal processor can be significant.

United States Patent Application Publication No. 2007/0017281, published on Jan. 25, 2007 is perhaps the closest prior art to the present invention in that it also utilizes some of the same principles and components as the present invention. However, because of arrangement and positioning of the components and other differences, this prior art apparatus does not offer many of the advantages of the present invention.

In light of the foregoing, there is a clear need in the art for wide field of view and short length MOFs without bulky ovens. In particular, there is a need for a rugged, low cost, small size, low weight, and low power MOF that is coupled with a detector and signal processor having equivalent size, weight, and power features. The present invention fills this need.

SUMMARY OF THE INVENTION

An apparatus of decreased size and weight and therefore well suited for placement on aircraft where size and weight of equipment must be minimized for detecting combustion sources in daylight includes an optical coupler, an optical entrance window followed, in the direction of the travel of the light signal, with a vacuum chamber into which a wide field-of-view, narrowband magneto-optical filter (MOF), and a light imaging system or device are mounted. The optical entrance window serves as a wall of the vacuum chamber. The optical coupler is configured to direct light into the optical entrance window from a surveillance area where combustion detection is desirable. The wide field-of-view narrowband MOF located in the vacuum chamber includes a first polarizer, a suitable vapor, such as an alkali metal or alkali earth metal vapor, and a second polarizer. The first polarizer induces a first polarization state of light transmitted through the first polarizer and is separated a first distance from the entrance window along a central optical axis. The second polarizer is oriented to substantively block light having the first polarization state; and is separated a second distance, greater than the first distance, from the optical window along the central optical axis direction. The narrowband polarization-changing material is disposed between the first and second optical polarizers and functions in a magnetic field created by permanent magnets. The narrowband polarization changing material changes polarization for a narrow wavelength band width on the order of about 0.01 nanometers (nm) that overlaps an optical wavelength associated with a local minimum in intensity of a daylight spectrum and overlaps an optical wavelength associated with a relatively high intensity in a combustion spectrum. The light imaging system or device, also in the vacuum chamber, is adapted to receive any light that is allowed to pass through the second polarizer in the event combustion produces image signals. The light imaging system or device is comprised of several components that per se are known in the art and are specified below. The image signals amplified and digitized in the light imaging device are then transmitted to an image analysis system, located outside of the vacuum chamber, for the determination of where combustion is evident in the surveillance area.

An aspect ratio, defined by a distance from the optical entrance window to the image detector surface divided by an optical aperture for the optical entrance window, is less than approximately 4.

The light image detector produces an image of a simultaneous field-of-view that has a size in a range from about 14 degrees to about 100 degrees.

By placing the light imaging system or device and its optional accessories within the vacuum housing of a magneto-optical filter assembly the apparatus, summarily described above, provides for extremely narrowband wide-area imaging which does not suffer all the disadvantages of prior art.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

The following specification, taken in conjunction with the drawings, sets forth the general principles and the preferred embodiments of the present invention. The embodiments of the invention disclosed herein are the best modes contemplated by the inventor for carrying out his invention in a commercial environment, although it should be understood that various modifications can be accomplished within the parameters of the present invention.

The invention is best described by first describing the design parameters and requirements for the operating principles and components utilized in the several embodiments of the invention.

Some of the general principles and components are already described in the prior art, such as for example in United States Patent Application Publication No. 2007/0017281, published on Jan. 25, 2007, the specification of which is expressly incorporated herein by reference.

General Principles, Design Parameters

The operation of a narrow band Magneto-optical filter based imaging system depends primarily on the parameters described below.

A) The Faraday Effect responsive elemental vapor selected;
B) The density of the elemental vapor;
C) The optical path length through the vapor;
D) The magnetic field intensity;

E) The polarizer efficiency;
F) The alignment of the polarizers, cell optical axis, and magnetic field axis; and
G) The system configuration and components.

Elemental Vapor

The Faraday effect occurs between two excited states in an elemental vapor. Zeeman splitting of the atomic energy levels occurs when an external magnetic filed is applied to the elemental vapor to cause a differential absorption and dispersion of right handed and left handed circularly polarized light. This difference causes plane-polarized light near an optical absorption transition in the vapor material to be rotated with little attenuation, known as the Faraday effect. The Faraday effect is illustrated by the block diagram of FIG. 3. Suitable materials include but are not limited to helium, the alkali metals that include lithium, sodium, potassium, rubidium, and cesium, and some alkaline earth metals such as calcium. Potassium is the generally preferred element for combustion imaging and is the preferred alkali metal used in all of the present embodiments of the invention, although the invention is not limited to the use of potassium vapors in the MOF filter.

Vapor Cell

Figure 4:
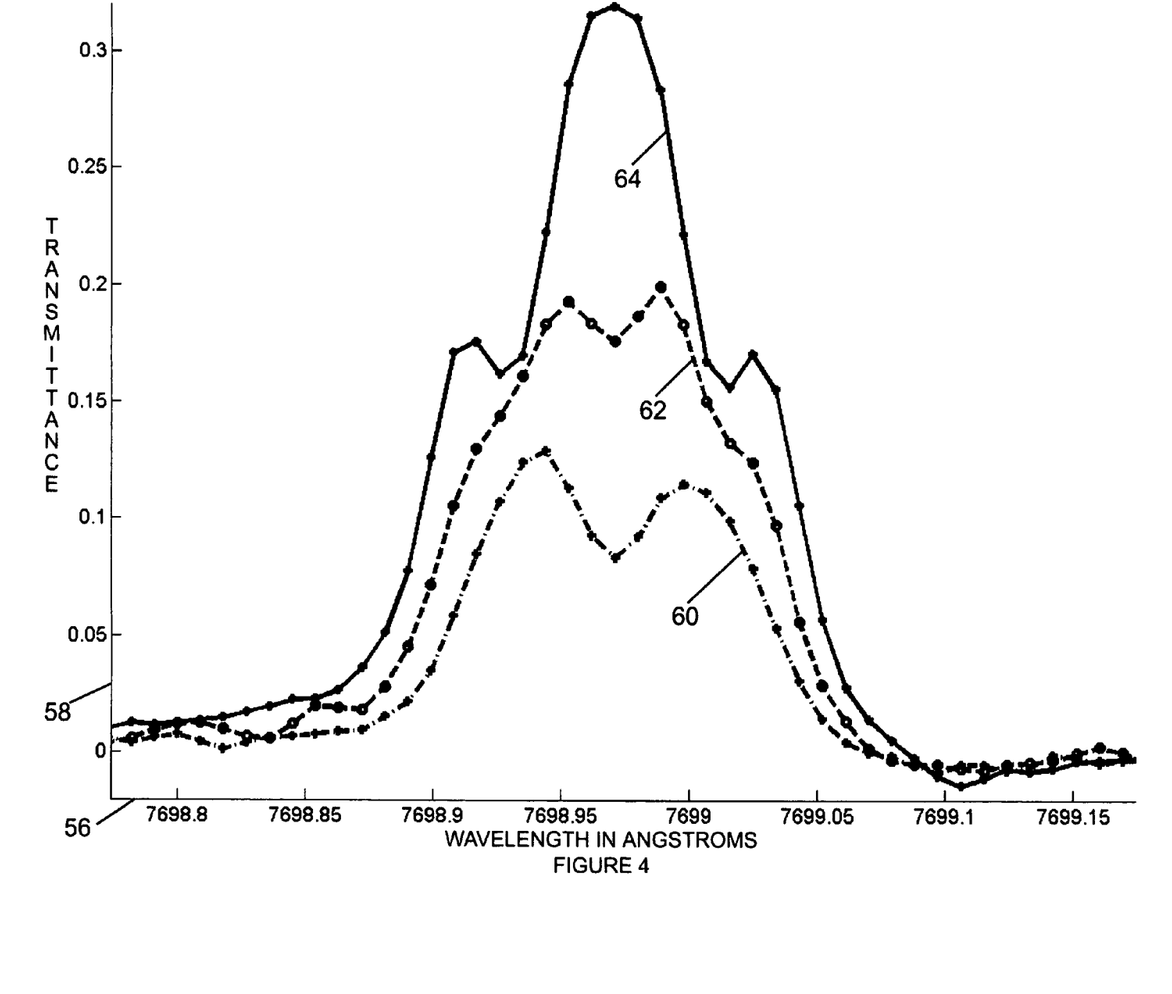
FIG. 4 is a graph that illustrates MOF performance for a potassium metal vapor at several temperatures.

Generally speaking the vapor cell has an optical path length through the vapor in the range of 0.1 to 6", more preferably in the range of 0.25 to 1". In most preferred embodiments the optical path length is 0.6". The vapor cell consists of an evacuated glass cylinder with entrance and exit windows transparent to light and a small amount of elemental potassium enclosed. A small hollow stub located on the circumference of the cylinder serves as a reservoir for the potassium and as a cold finger for condensation of the metal. The circumference of the cylinder is heated, as is the cold finger, though the cold finger is kept a few degrees Celsius cooler to inhibit condensation of potassium on the windows. The temperature of the cold finger is precisely controlled to achieve optimum vapor density, typically in the range of 80° C. to 120° C., with 110° C. typically being optimum for potassium. The optimum temperature may be determined (calibrated) by means of feedback from the optical signal. The signal strength from a source light near the vapor's wavelength will pass through local minima and maxima as the temperature is increased and the phase delay shifts thru successive multiples of 90°. The first maximum encountered is the optimum as is shown in the graph of FIG. 4. It has the minimum through-light losses while still blocking the background light. This corresponds to the density at which the combination of magnetic field, Faraday effect, source light characteristics, and path length result in the optimum rotation of the planar polarized light passing through the cell. This optimum may vary for different sources depending on their velocity, internal light absorption, and intensity.

Magnets

Figure 1:
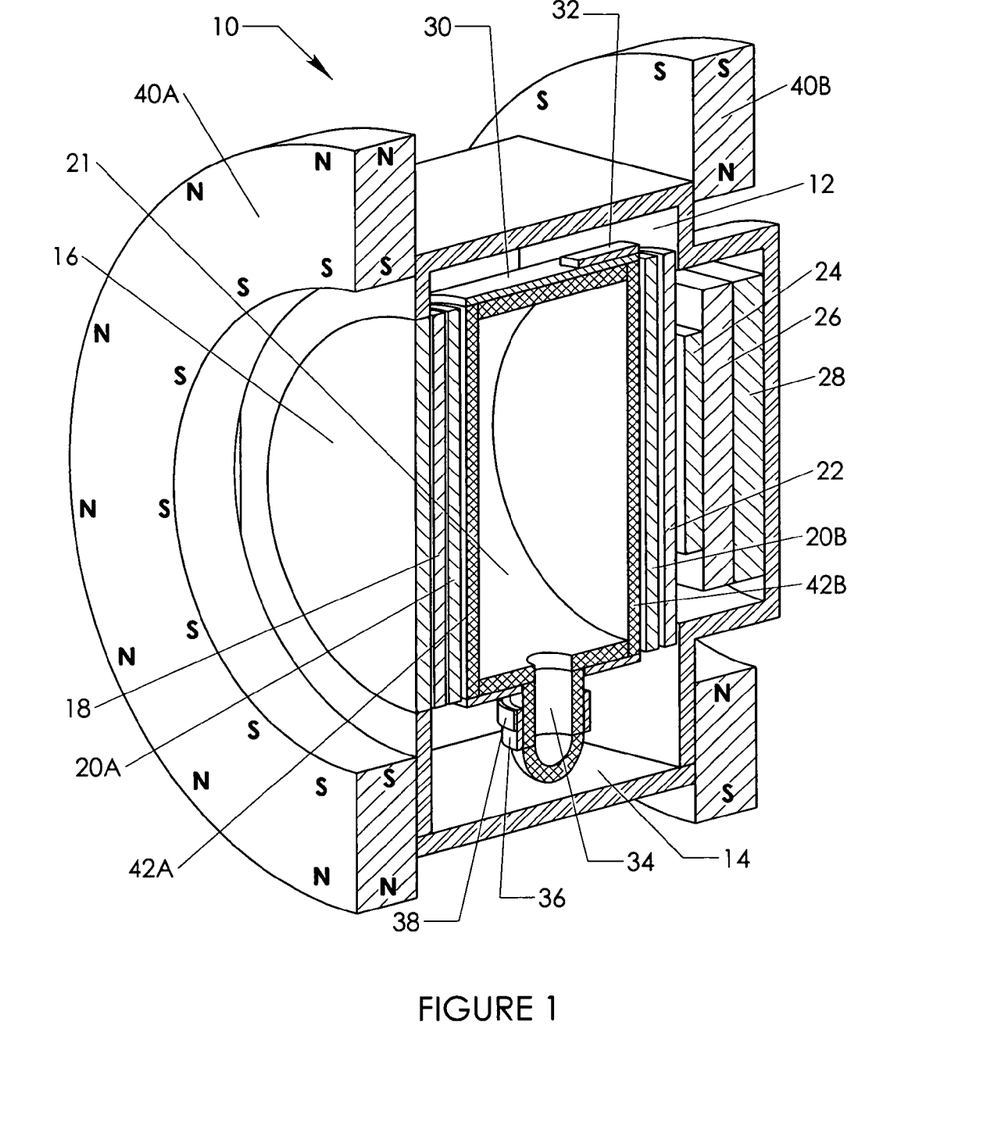
FIG. 1 is a simplified perspective view block diagram that illustrates the presently preferred embodiment of the compact narrow band imaging system of the present invention.

Magnets are located adjacent to the vapor cell and are arranged to provide a uniform field through the length of the cell in a range from about 100 gauss to 5000 gauss, with a range from 400 gauss to 1500 gauss preferred and a field intensity near 1200 gauss being optimal for potassium. The magnetic field strength determines the width of the Zeeman splitting and therefore the bandwidth of the filter. Different applications may have different optimums depending on the light source characteristics. For use in the present invention Samarium Cobalt permanent magnets are ideal as they are small, have a high magnetic intensity, and require no external power source. Whereas magnets have been used in the prior art, using a permanent magnet in this application is a novel and inventive feature of the present invention. Good uniformity of field is obtained when the axial distance between two radial magnetized magnets is approximately equal to the diameter of the imaging aperture within them. Radial magnetization in these implementations means that one pole of each magnet is oriented toward the optical axis and the opposing pole is located away from the optical axis. The two magnets of the present invention have opposite magnetic polarizations to produce a field between them as illustrated in FIG. 1. Uniformity of the magnetic field maintains uniform optical polarization rotation across the Vapor cell's diameter and is necessary to obtain uniform transmission intensity (optical sensitivity) across the field of view, with uniformity to within a 100 gauss range acceptable and less than 10 gauss preferred. Alignment of the magnetic field along the axis of the cell assures uniformity of transmission as well. The magnets may be located either inside or outside the vacuum inner chamber.

Polarizers

The entrance and exit polarizers are located at their respective vapor cell windows. In the preferred embodiments high extinction coefficient, high acceptance angle thin absorptive type polarizers are preferred. The polarizers are oriented at 90° to each other to block light not rotated within the vapor cell.

Alignment

For optimum operation the axis of the polarizers, the magnetic field, and the vapor cell are aligned with each other. Misalignments may cause variations in the path length of light through the cell and therefore in its polarization rotation, variations in the magnetic field intensity which may affect the uniformity of the transmission bandwidth, and variations in the efficiency of the polarizers which may affect their percent light transmission.

Construction

To maintain the tight temperature control required in the vapor cell it is insulated from the external environment. This has been done in the prior art by placing the vapor cell alone within end caps of still air or vacuum.

The present invention also includes a magneto-optical filter (MOF) that in the broad sense of the term includes an optical entrance window. The optical entrance window in accordance with the present embodiments serves, as a wall of a thermal isolation evacuated housing, also termed vacuum chamber, in which the vapor cell and several other components are contained. The MOF includes a first polarizer, a narrowband polarization-changing material within a vapor cell, and a second polarizer. The optical entrance window admits light to the filter. The first polarizer induces a first polarization state of light transmitted through the first polarizer and is located along a central optical axis. The narrowband polarization-changing material within a vapor cell is disposed between the first polarizer and a second polarizer. The second polarizer is oriented to substantively block light having the first polarization state. The second polarizer is also located along the central optical axis. The polarization-changing material changes polarization for a narrow wavelength bandwidth on the order of about 0.01 nanometers. Differential control of the temperature of portions of the vapor cell containing the polarization altering material is used to reduce condensation of the vapor on the vapor cell windows so that no significant interference with light transmission can occur for hundreds to thousands of hours or more. As noted above, the polarizers and vapor cell are both contained within a thermal isolation evacuated housing, also termed vacuum chamber, such that no optical window between the first polarizer and second polarizer is subject to the polarization-inducing stresses of atmospheric to vacuum transitions. A negligible portion of light transiting the apparatus incident at an incident direction less than a maximum acceptance angle from the central axis is scattered into a different direction.

As a consequence of this arrangement, the magneto-optical filter transmits light in the narrow wavelength band over a range of directions up to the maximum acceptance angle around the central axis. In accordance with the present invention there is no optical exit window within the vacuum chamber. The transmitted light in the narrow wavelength band exits the magneto-optical filter without passing through an exit window that would normally be present in the prior art and enters the entrance aperture of the light imaging system or device. The light imaging system or device converts the light into electrical signals, amplifies and digitizes them, and then transmits them out of the vacuum chamber and into an image analysis system.

Thus, in the present invention the placement of the light imaging system or device and of its optional accessories occurs in a novel manner, and provides the advantage that there are no optical losses of the type that would be present if there were an exit window.

A pre-filter is located on the central optical axis between the entrance window and the vapor cell to enhance the rejection of background light. Placing the pre-filter within the vacuum chamber is also a novel feature of the present invention.

Light Imaging System or Device, Image Detector

As noted above in accordance with one aspect of the invention the vacuum chamber encloses the light imaging system or device that has several components. One component is an image detector that itself is an assembly of several components all of which per se are known in the art. In preferred embodiments the image detector assembly is of a type that includes an Electron Multiplying Charge Coupled Device (EMCCD) signal amplifying detector, a thermoelectric cooler, and a high-speed signal digitizer as one hybrid component. Those of ordinary skill in the art will readily understand that the light imaging system and/or image detector can include several variations or versions and combinations of signal amplifiers (such as an electron multiplier), signal processors and signal digitizers. Placing the light imaging system within the vacuum housing moves it closer to the vapor cell increasing the field of view available. It also provides thermal isolation for the thermoelectric cooler of the image detector assembly enabling it to control temperature with less power consumption. Incorporation of the light imaging system or device into the vacuum housing eliminates the exit window and the need for many of the optical focusing components previously located between the vapor cell and the light imaging systems of the prior art, all of which induce signal losses. In other words, moving the image detector's focal plane physically close to the exit polarizer increases the field of view available and also eliminates not just the exit window, but also the need for (and losses from) the external camera's optics and thermal isolation system.

Other benefits of this configuration include reduced size and weight, reduced susceptibility to misalignments resulting from vibration or external stresses, and a more reliable vacuum housing due to one less hermetically sealed opening. Building the light imaging system into the housing also eliminates the potential for dust, dirt, and other contamination of the optical system to get into the space between the filter and a separate imaging system.

Signal Digitizer

Digital signals are almost completely immune to noise caused by electromagnetic interference (EMI). When the vacuum chamber is constructed as an electrically conductive chamber it acts as a Faraday cage, blocking external electromagnetic interference. External noise sources are reduced or eliminated by converting the image signals from analog to digital while still within the vacuum chamber. A high speed, low noise, analog to digital converter (ADC) may be included in the imaging system or device and its accessories for this purpose. Lower noise is obtained with this class of ADC by cooling it. Having the ADC near the image detector or having it as a component of the imaging system or device provides for a common cooling system with the detector and shortens the length of EMI susceptible electrical connections between the devices.

As noted above, thermoelectric coolers are preferred and are used in the preferred embodiments of the present invention, but they are not the only option for cooling the imaging chip as other types of refrigeration systems are well known in the art and could also be used in the present invention.

Heat Reflector

Generally speaking a disadvantage of placing the light imaging system or device in close proximity to the vapor cell is heat transfer. This is because the vapor cell operates best at high temperatures while the light imaging system operates best at low temperatures. By placing both components within an evacuated housing, as in the present invention, convective heat transfer is minimized. Conductive heat transfer may be minimized by the use of insulated mounting hardware within the housing. Thus, to minimize radiation heat transfer the preferred embodiment incorporates a heat reflective post-filter between the second polarizer and the light imaging device. This may be implemented as an independently mounted broad bandwidth interference filter commonly known as a "hot mirror" or as a "hot mirror" interference filter coating applied to a surface between the vapor cell and the image detector. This coating reflects radiated heat back into the vapor cell and from there out of the entrance window. The hot mirror coating used in this invention is designed to reflect radiant heat generated by the vapor cell at wavelengths longer than those of the image signal (1 micron to 10 micron) while transmitting the image signal with minimal loss.

Pre-Filter

In accordance with another aspect of the present invention the vacuum chamber also encloses a pre-filter. In a preferred embodiment the pre-filter is a narrow band (roughly 10 nm bandwidth) optical interference filter centered at the transition wavelength of the elemental vapor. This pre-filter blocks over 98% of the background light spectrum from entering the MOF. Placement of the pre-filter within the vacuum housing protects it from environmental effects that can cause shifts in the center wavelength, bandwidth, and transmission efficiency over time.

Entrance Optics

The field of view of the imaging system is determined by the focusing optics placed before the entrance window. Depending on the application these may be wide angle, limited angle, or tightly focused. Optimal optics will produce an image focused on the image detector's focal plane with minimal scattered light.

DETAILED DESCRIPTION OF THE PREFERRED EMBODIMENTS

In the following description reference is to be had to the attached drawings figures. In order to provide a thorough understanding of the present invention numerous specific details are set forth. It will be apparent, however, to one skilled in the art that the present invention may be practiced without some of the herein described specific details. Some parts and components of the invention which per se are known in the art are shown in block diagram form only, in order to avoid unnecessarily obscuring the present invention.

In the preferred embodiments a heated potassium vapor MOF is enclosed in an evacuated housing or vacuum chamber. However, the invention is not limited to the use of potassium vapor. In other embodiments, other materials, both in vapor and non-vapor states, may serve to change polarization between the two polarizers, for a narrow wavelength band on the order of 0.01 nm, allow for unscattered transect of light in multiple directions, and still maintain an aspect ratio of 4:1 or less to support wide field-of-view imaging. For example, it is anticipated that other alkali metal vapors can be used in various embodiments; especially vapors of those metals that emit light during combustion at wavelengths that align with Fraunhofer lines. As used herein, optical refers to electromagnetic waves in the ultraviolet, visible, near infrared (NIR) and short wavelength infrared.

FIG. 1 of the appended drawings is a block diagram that illustrates in perspective the presently preferred embodiment of the invention.

The components of the compact narrow band imager 10 are illustrated in a diametric perspective cross-sectional view located mid-plane of the device and coincident with the optical axis. The evacuated housing is the vacuum chamber 12 that includes the vacuum chamber base 14, and a vacuum chamber window 16 that serves as the optical entrance window and as a wall of the vacuum chamber 12. Contained within the evacuated housing or vacuum chamber 12 and proceeding along the incoming light path are a pre-filter 18, an entrance polarizer 20A, a vapor cell 21, an exit polarizer 20B, a heat reflective filter 22, and an image detector 24. A signal processor 26 consisting of a signal amplifier and a signal digitizer is located in close proximity to the image detector 24 along with a cooling device or chiller 28, all of which are still within the vacuum chamber 12. The image detector 24, signal processor 26, chiller 28, are shown separately in FIGS. 1 and 2 although they can be considered as the parts forming the image detector assembly and as such being included in the broader concept of light imaging system or device.

The vapor cell 21 has a cell heater 30 around its circumference with a temperature sensor 32 located on the cell heater's 30 surface. Protruding from the cylindrical vapor cell's 21 central cavity is the vapor cell's reservoir 34. The reservoir 34 has a separate reservoir heater 36 along with a reservoir temperature sensor 38 located on the reservoir heater's 36 surface. Moving outside of the evacuated housing, magnets 40A and 40B are mounted to the entrance and imaging sides of the vacuum chamber 12 respectively.

At the compact imager's 10 core is the vapor cell 21 containing elemental potassium both as vapor and as a solid or liquid metal film deposited on the internal walls of the reservoir 34. The vapor cell 21 is constructed of a suitable non-reactive material such as a ceramic, with fused quartz being the preferred embodiment. The two walls or windows 42A and 42B of the vapor cell 21 are the ones through which the light signal travels. These are not to be confused with optical entrance window 16 that serves as a wall of the vacuum chamber 12, or with the exit windows of prior art devices that in the prior art also serve as a wall of the vacuum chamber 12. As stated above, in the present invention there is no such optical exit window and the elimination of this component provides several advantages described above.

The vapor cell 21 has two separate heaters. The cell heater 30 is located around the larger circumference of the vapor cell 21. The reservoir heater 36 is located around the circumference of the reservoir 34. Laminated polyimide film heaters such as those manufactured by Minco Corp. are suitable for both heaters. Still other components mounted directly to the vapor cell 21 are the vapor cell temperature sensor 32 and the reservoir temperature sensor 38. These sensors are selected from commonly available high accuracy devices such as thermistors, RTDs, or thermocouple devices per se known in the art.

Located immediately adjacent to each window 42A and 42B of the vapor cell 21 are high acceptance angle thin absorptive polarizers 20A and 20B. They are commercially available from several vendors. As detailed previously, the entrance 20A and exit 20B polarizers' polarization planes are oriented at precisely 90 degrees to each other in order to block light that has not had its polarization rotated 90 degrees within the vapor cell 21. In the preferred embodiment these polarizers are mounted a small distance away from the vapor cell's windows.

On the image detector side of the exit polarizer 20B and still in the vacuum chamber 12 the heat reflective filter 22 is installed having a preferred reflection of >90% for wavelengths from 1 micron to 10 microns and a preferred transmission of >98% at the vapor cell 21 transmission wavelength. The heat reflective filter 22 reduces the heat load on the image detector 24, on the signal processor 26, and on the chiller 28 thereby reducing the overall power consumption of the system and electronic noise.

Continuing away from the heat reflective filter 22 and toward the image detection side of the system, the next component that the light encounters is the image detector 24, still within the vacuum chamber 12. It is located adjacent to, but preferably not in contact with the heat reflective filter 22. In the preferred embodiment the image detector 24 is of the electron multiplying charge coupled device (EMCCD) type having an integral signal amplifier and also incorporates an integral signal digitizer 26, and an integral thermoelectric chiller 28 as a combined single component. Alternatively, equivalent signal performance can be obtained by using an image intensified charge coupled device type image detector instead of the EMCCD detector, though at the expense of increased size, weight, power consumption, and complexity of the imaging system.

Referring now again to the entrance side of the apparatus, in the preferred embodiment the narrow bandwidth pre-filter 18 is installed between the entrance polarizer 20A and the vacuum chamber window 16. The pre-filter 18 may be mounted on either side of the vacuum chamber window 16 or in alternative embodiments it may be used in place of the vacuum chamber window 16. However, in the preferred embodiments of the invention the pre-filter 18 is inside the vacuum chamber 12. The narrow bandwidth (approximately 10 nm) pre-filter's 18 center wavelength is matched to the center wavelength of the vapor cell's 21 transmission band. This filter 18 rejects most background light while transmitting wavelengths in the vapor cell's 21 transmission band. The pre-filter 18, pre-filter coatings, heat reflective filter 22, and heat reflective filter coatings are generally custom manufactured to specifications and may be obtained from a number of vendors including Newport Corporation, Irvine, Calif. and Melles Griot Inc. Carlsbad, Calif. The vacuum chamber window 16 is a conventional imaging quality window fabricated from any of a variety of suitable materials including fused quartz or borosilicate glass. Such windows may be purchased from a number of optical vendors including Newport Corporation and Melles Griot Inc. The vacuum chamber window 16 actually forms the wall of the vacuum chamber 12 through which the light signal may enter and is hermetically mounted and sealed to the vacuum chamber 12 by conventional means such as adhesive, solder, o-ring, etc. (not shown).

The rest of the vacuum chamber 12 is fabricated of a strong non-magnetic alloy such as titanium or AISI type 304 stainless steel to avoid distortion of the magnetic field within the vapor cell 21 and to provide structural integrity to the assembly.

On the outside of the vacuum chamber 12 are two ring magnets 40A and 40B used to generate a uniform magnetic field of approximately 1200 Gauss within the vapor cell 21. The ring magnets 40A and 40B may be purchased from vendors such as Dexter Magnetic Technologies, Fremont, Calif. as assemblies of stock magnets, or in the preferred embodiment as radially magnetized samarium cobalt rings. The rings must be oppositely magnetized to create the desired uniform field within the cell i.e. with the North Pole at the center in one ring and the South Pole in the center of the matching magnet ring. In this embodiment a vacuum chamber base 14 is shown to illustrate a preferred method for hermetically sealing the evacuated housing after all components have been installed.

In the preferred embodiment a single multi-wire hermetically sealed feed-thru cable (not shown) is placed at any suitable location in the vacuum chamber 12 or vacuum chamber base 14 to provide electrical connections for the heaters 22 and 36, the temperature sensors 32 and 38, and the image detector components 24, 26, and 28. A power source(s) (not shown) for the heaters and all other parts or components is/are located outside of the vacuum chamber 12 and the power is introduced into the vacuum chamber 12 through the cable. The use of a single feed-thru cable improves reliability, reduces weight, and improves the hermeticity of the evacuated housing. The hermetically sealed feed-thru cable also carries data from the image detector 24 or signal processor 26 to an image analyzing system or image processor 44 that is shown and described in connection with FIG. 5.

The components of the compact narrow band imaging system 10 may be mounted to each other by conventional means including adhesives, screws, brackets, welding, soldering, springs, interference fits, and the like (not shown). The finished compact narrow band imaging system 10 (not including the processor 44 or optical coupler 68 shown in FIG. 5) measures approximately 1.7" diameter by 1.5" deep occupying a volume of only 3.4 cubic inches and having a mass of <1 pound, sufficiently small to fit within the space and mass constraints of aircraft.

Figure 2:
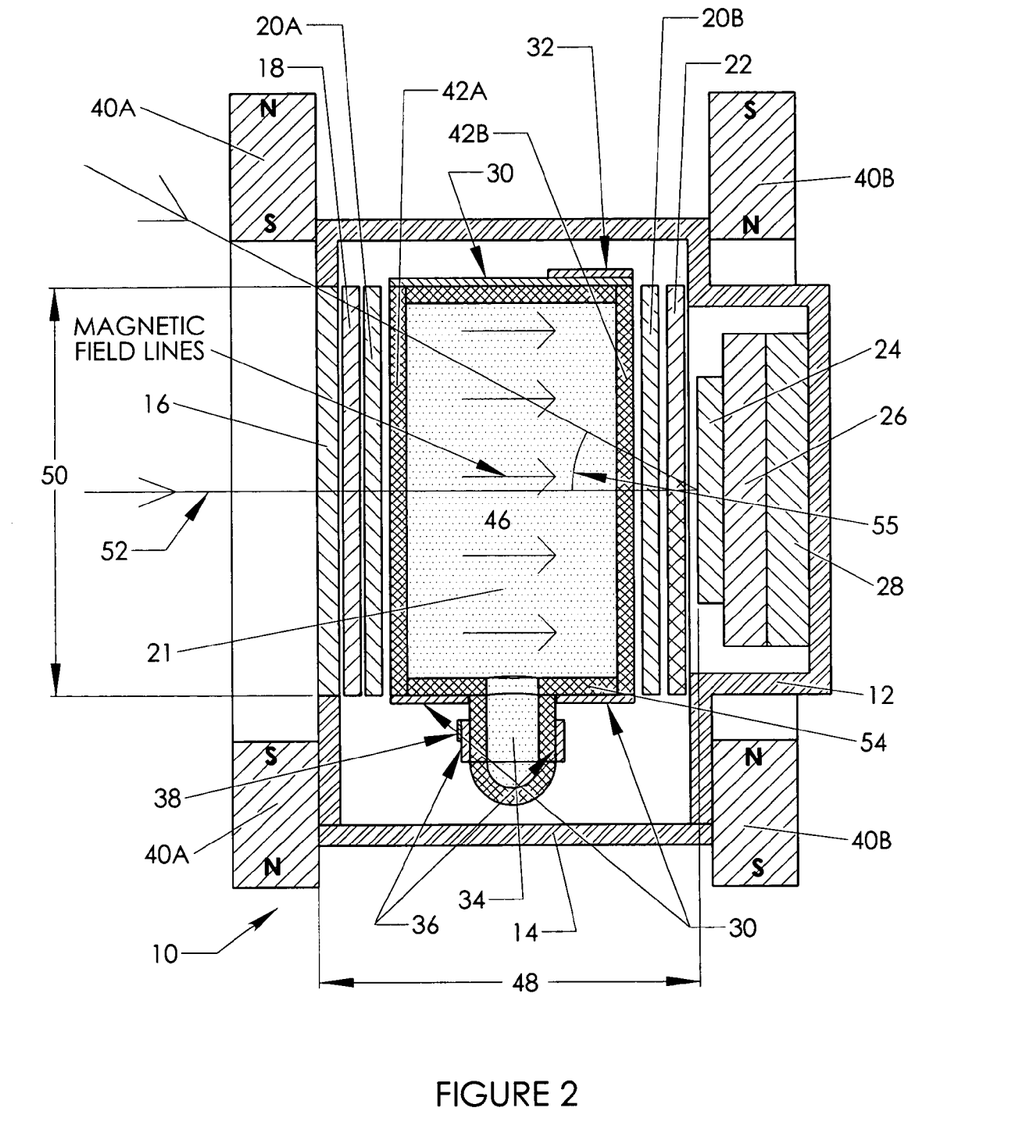
FIG. 2 is a block diagram cross-section of a compact narrow band imaging system of the preferred embodiment.

The operation of the compact narrow band imager 10 is reviewed as follows in connection with FIG. 2. FIG. 2 is a planar cross-sectional view mid-plane of the presently preferred embodiment and coincident with the optical axis of the imager 10. The preferred embodiment shown is for a wide field of view configuration.

Light from the source to be imaged enters the vacuum chamber window or entrance window 16 after passing through optical coupling means (illustrated schematically in FIG. 5) that eliminate light rays exceeding the acceptance angle 55 of the system and that focus the source image at the plane of the image detector 24. Many types of conventional optics are suitable for optical coupling, including wide angle, telescopic, microscopic, fiber optic, scanning, and the like. After passing through the vacuum chamber window 16 the light next passes through the pre-filter 18 where most extraneous light that is not at the magneto-optical filter's passband wavelengths is removed. In the preferred embodiment that is based on the emission lines corresponding to potassium and potassium vapors in the MOF the pre-filter 18 transmits light in the wavelength band of 764 nm to 772 nm. This transmitted light next passes through the first or entrance polarizer 20A where all light not matching its polarization orientation is removed. This now polarized light next passes through the vapor cell entrance wall or window 42A and into the vapor cell 21. As the light passes through the vapor cell 21 the polarization of those wavelengths matching the extremely narrow energy level bands of the magnetically oriented potassium vapor 46 rotates by 90 degrees. The light then passes through the vapor cell exit wall or window 42B and into the exit polarizer 20B that has a linear polarization orthogonal to that of the entrance polarizer 20A. The exit polarizer 20B then removes source light that has not been rotated by 90 degrees and the remaining light passes on to the heat reflective filter 22. The heat reflective filter 22 reflects long wave infrared light generated by the vapor cell 21 itself while passing the remaining source light through to the image detector 24. Light striking the image detector 24 is converted to analog voltages by its charge-coupled devices. These analog voltages are then amplified by the electron multipliers and converted to digital signals by the signal digitizer within the signal processor 26.

Certain details of construction, operating parameters and possible modifications are further disclosed as follows.

In some embodiments (not specifically shown) the chamber 12 instead of being evacuated may contain an insulating gas such as air or nitrogen.

The imager apparatus 10 has optical length that is indicated in FIG. 2 with the reference numeral 48 and optical aperture 50 that produce an optical aspect ratio of 4:1 or less. A central optical axis 52 is a line segment through the middle of the polarizers 20A and 20B and the vapor cell windows 42A and 42B.

To ensure a small aspect ratio for the overall imager 10, the vapor cell 21, itself, has a small aspect ratio. For example, in an exemplary vapor cell for potassium, the aspect ratio is on the order of one, well below the aspect ratio of 5:1 in conventional cold cell MOFs. More specifically, in an exemplary vapor cell for potassium of the specific embodiment the imaging length 48 is 1.10 and the window 16 has an optical clear aperture of 1.15 inch in diameter, for an aspect ratio on the order of 0.96:1. The aspect ratio 0.96:1 corresponds to a maximum acceptance angle of about 27.5 degrees and a field of view of about 55 degrees. Thus, an embodiment dimensioned to have an aspect ratio less than or equal to 2:1 yields a field of view sufficiently wide to maintain the advantages of the present invention.

As noted above, the vapor cell 21 includes chamber heater elements 30 and temperature sensors 32 and 38. The heater elements 30 are adapted to prevent condensation on the vapor cell windows 42A and 42B. In alternative embodiments, the heater elements 30 can be applied to any of the applicable walls 54 of the vapor cell 21, including to the transparent vapor cell windows 42A and or 42B. However in the illustrated preferred embodiment, the heater elements 30 are applied only to the side walls 54 of the vapor cell 21, and are not on the vapor cell windows 42A and 42B. The vapor cell windows 42A and 42B are nevertheless adequately heated by conduction of heat through the side walls 54 of the vapor cell 21. The combined effects of reservoir heater 36 and heater elements 30 affect the density of the vapor, and thus fine tune the filter wavelength characteristics, as explained previously.

An effective level of vacuum for the vacuum chamber 12 for insulation and to reduce heat loss is easily determined by routine experimentation. For a potassium vapor cell, a vacuum of less than about 10 Torr is sufficient to reduce convective heat loss that would allow condensate to form on windows 42A and 42B. In an exemplary embodiment, a vacuum of less than 0.001 Torr was implemented.

The optimum temperature for a particular application can also be determined readily by routine experimentation and then monitored during operation using the temperature sensor 32. For example, in a vapor cell for potassium, with the dimensions described above, made of glass with windows of glass, housed in a low pressure vacuum in the range of 0.001 to 10 Torr, a temperature of 120 degrees Celsius, as sensed by the sensor 32, and a temperature of 110 degrees Celsius, as sensed by the sensor 38, is sufficient to avoid condensation on the vapor cell windows 42A and 42B. Thus, the preferred embodiment of the imager 10 has no practically observable condensation layer in the vapor cell 21. In alternative embodiments some condensation may occur on the walls 54 of the vapor cell 21, but not on the windows 42A and 42B. Without the heater elements 30 potassium would condense on the windows 42A and 42B in a matter of minutes, and would render the imager 10 inoperative. With the heater elements 30, condensation can be avoided for hundreds to thousands to tens of thousands of hours, thereby providing a long operational lifetime for the imager 10.

Figure 3:
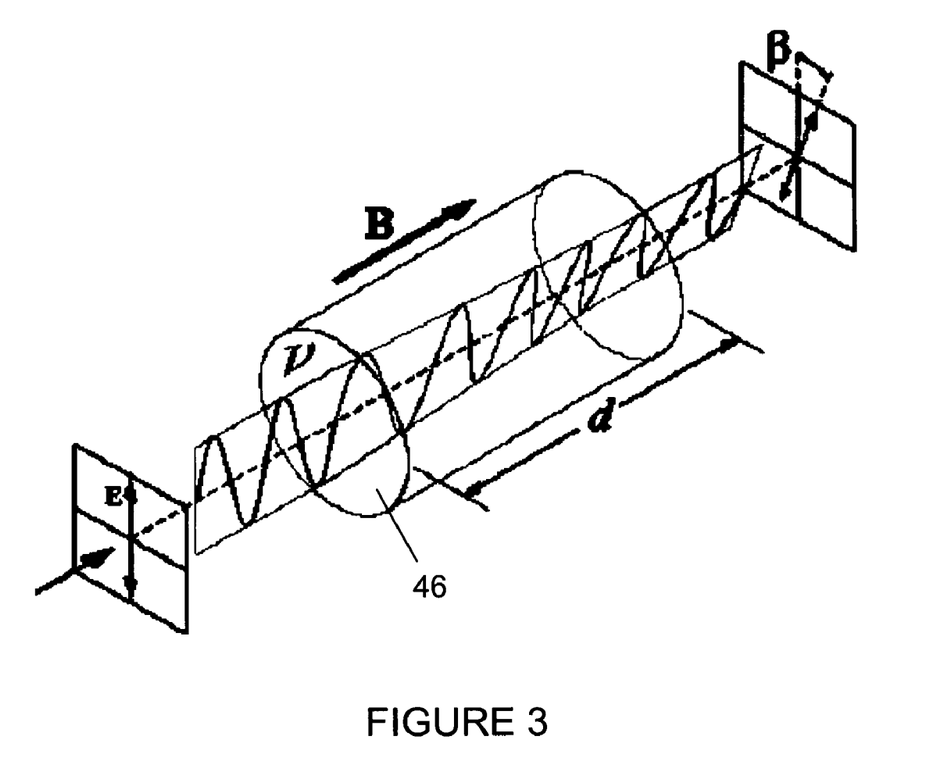
FIG. 3 is a block diagram that illustrates the Faraday effect.

FIG. 3 is a block diagram illustrating the Faraday effect that forms the theoretical basis for the operation of the imager 10. Light of a polarization E entering a diamagnetic material (such as potassium vapor 46) has its polarization orientation rotated. The relation between the angle of rotation of the polarization and the magnetic field in a diamagnetic material is:

$$\beta = \nu B d$$

where
  $\beta$ is the angle of rotation
  B is the magnetic flux density in the direction of propagation
  d is the length of the path where the light and magnetic field interact
  $\nu$ is the Verdet constant for the material. This empirical proportionality constant varies with wavelength and temperature and is tabulated in the known art for various materials.

FIG. 4 is a graph that illustrates imager performance for potassium vapor at several reservoir temperatures, as determined using the preferred vapor cell embodiment. The horizontal axis 56 of the graph indicates wavelength of light incident through the first polarizer 20A in Angstroms (1 Angstrom=0.1 nm). The vertical axis 58 of the graph indicates transmittance through the second polarizer 20B in fraction of incident optical intensity. A transmittance of zero (0) indicates complete blockage and a transmittance of one (1) indicates complete transmission with no loss of optical energy.

The graph of FIG. 4 includes three traces 60, 62, 64. Trace 60 indicates the shape of the MOF filter response at a first reservoir temperature. Trace 62 indicates the shape of the MOF filter response at a second reservoir temperature. Trace 64 indicates the shape of the MOF filter response at a third reservoir temperature, e.g., 120 degrees Celsius. The graph shows best performance at 120 degrees Celsius. Transmittance is greater than 30%, with a full width at half maximum (FWHM) of about 0.15 Angstroms (0.015 nm). This is suitable for detection of narrow-band optical emissions from combustion and also coincides with a solar Fraunhofer line of 769.9 nm.

As described above, in the preferred embodiments, the polarizers 20A and 20B are inside vacuum chamber 12. It is recognized that the entrance polarizer 20A can be outside of vacuum chamber 12. However, an advantage of placing the polarizers 20A and 20B inside the vacuum chamber 12 is that the imager 10 is less subject to stresses that can degrade the purity of the polarized light produced. For example, the vacuum chamber window 16 is subject to stress in response to the pressure difference between the inside and outside of the vacuum chamber 12. Such stress degrades the purity of polarized light passed by the window 16 and can introduce orthogonal components at wavelengths other than the metal vapor transition wavelength to polarized light passed from an external polarizer. By placing the polarizers 20A and 20B inside the vacuum chamber 12, the spurious polarization produced by the window 16 is blocked by the first polarizer 20A. The pre-filter 18 is placed on the image source side of the first polarizer 20A for the same reason, to avoid shifts in polarization between the polarizers 20A and 20B other than those created by vapor 46 in the vapor cell 21. Special care is used in mounting of both polarizers 20A and 20B and the vapor cell windows 42A and 42B to avoid introducing stresses that could cause undesirable polarization changes.

Because the second polarizer 20B is mounted on the image detector side of the vapor cell 21 there are no pressure gradients to the outside in this invention as both the polarizer 20B and the image detector 24 are contained within the same vacuum chamber 12.

The heat reflective filter 22 located between the second polarizer 20B and the image detector 24, as described above, reduces the heat load on the image detector 24 by reflecting or absorbing infrared radiation in a wavelength range preferably from 1 micron to 10 microns, but acceptably in a range from 2 to 5 microns.

Narrower or wider field of view configurations may be obtained by adjusting the aperture diameter and imager length while adhering to the design considerations described above.

Applications for the wide field of view compact narrow band imaging system of the present invention include, but are not limited to, existing Faraday filter implementations such as combustion warning systems, environmental monitoring (including wildland fires, urban fires, crop health, mineral prospecting, LIDAR meteorology, etc.), solar research, secure communications links, Forward Looking Infrared Surveillance system (FLIR), welding observation and the like.

Figure 5:
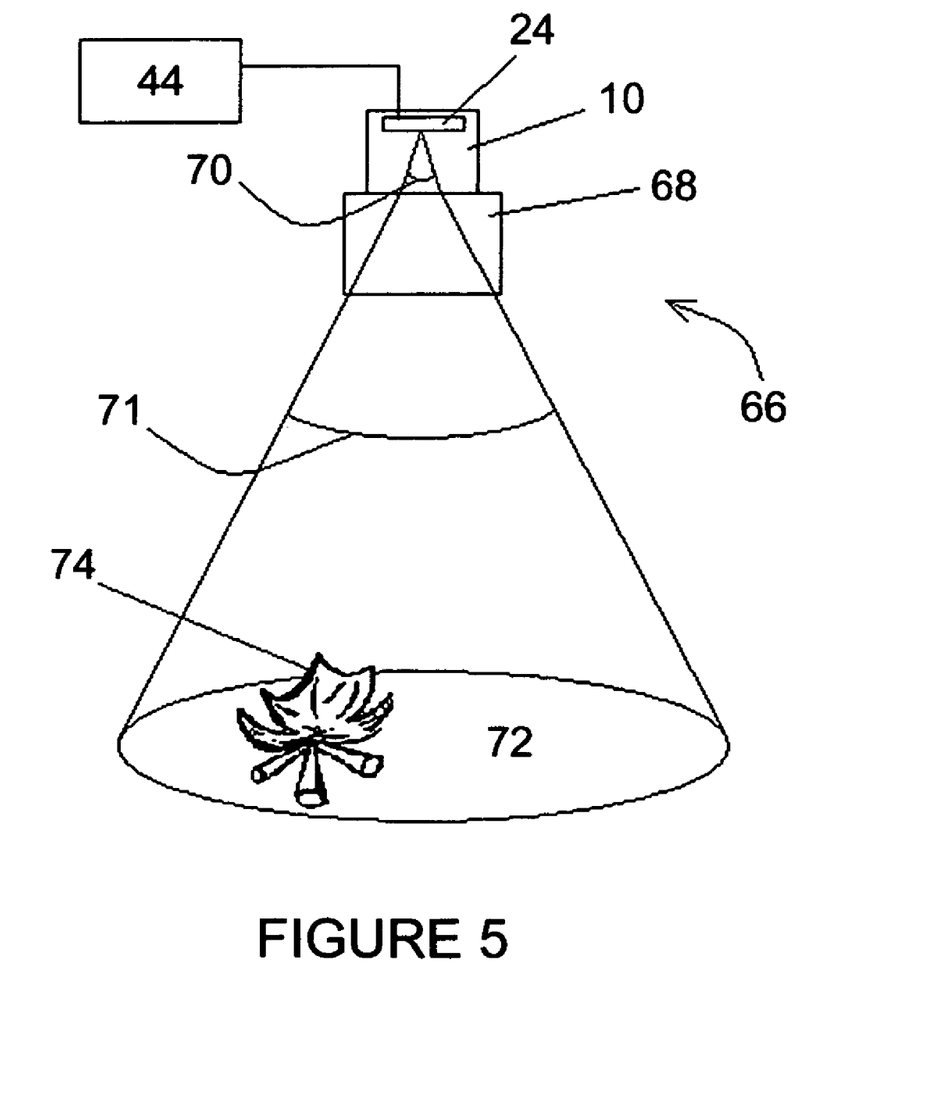
FIG. 5 is a block diagram that illustrates a warning system that uses the compact narrow-band imaging system, in accordance with the present invention.

FIG. 5 is a block diagram that illustrates an overall combustion warning system 66 that uses one or more compact narrow-band imagers 10 of the present invention. The combustion warning system 66 includes an image analyzing system or image processor 44 and one or more compact narrow-band imagers 10, and optical couplers 68 for each imager 10. For detecting flames of combustion, including flames emanating from a missile or discharge of firearms and the like, that embodiment of the imager 10 is used in which the metal vapor 46 in the vapor cell 21 matches the metal in a combustion target and also coincides with a minimum in the daylight absorption spectrum, so as to fall in a Fraunhofer line. This in most cases is potassium and the Fraunhofer line is 766.4 nm and/or 769.9 nm. The basic field of view of the imager 10 is given by twice the acceptance angle and is determined by the optical aspect ratio of the imager. For the preferred embodiment with potassium vapor cell 21 described above, with an aspect ratio of 0.96:1, the basic field of view 70 is 55 degrees.

The optical coupler 68, shown only in FIG. 5, is utilized to direct higher angles into the imager 10. The effect of directing higher angles into the imager 10 is to expand the field of view beyond that of the basic field of view. The already large basic field-of-view of the imager 10 allows the coupling optics to be compact and have sufficient effective aperture while achieving a wide expanded field-of-view. It is assumed for purposes of illustration that the optical coupler 68 directs light incident at 53 degrees into an angle of 26.5 degrees at the vacuum chamber window 16. Since the 26.5 degrees is within the maximum acceptance angle of the exemplary embodiment, the light is accepted and focused at the imager's 10 image detector 24. The expanded field of view is then 106 degrees, represented by the expanded field of view 71 in FIG. 5. It is assumed for purposes of illustration, that the expanded field of view 71 intersects a flat ground as surveillance area 72.

In some embodiments, the optical coupler 68 may include a pre-filter (not specifically shown) to filter out one of the two transition wavelengths to be detected by the imager 10. For example, a potassium vapor imager would detect wavelengths near 766.4 nm and near 769.9 nm. A pre-filter can be used, for example, to filter out a large band of wavelengths that include the 766.4 wavelength. With such a pre-filter, the imager 10 passes only a single or reduced number of wavelength bands, for example a bandwidth of approximately 1.0 nm, centered at 769.9 nm (one potassium Fraunhofer line). Such a pre-filter in the optical coupler 68 eliminates the background light between the two Fraunhofer lines that would otherwise enter the system 10. This type of embodiment would be more likely used with a narrow angle of view optical coupler imaging high intensity sources because it is much lower in signal but much better in discrimination against background light. Very high intensity sources such as the sun, arc welding, ICBM launches, etc. may be better observed with an embodiment having such a narrow bandwidth pre-filter in the optical coupler 68. The presently most preferred embodiment does not include such a pre-filter.

Referring still to FIG. 5, pixel data from the image detectors 24 of one or more imagers 10 is fed to image analysis system or the processor 44 where detection algorithms are executed for each pixel or group of pixels. The algorithms are implemented as hardware or software or some combination. Detection algorithms are well known in the art and need not be disclosed here. The orientation and altitude of the imagers 10 is used by processor 44 to associate pixels in the image data with a direction from the overall combustion warning system 66. For example, the processor 44 determines that one or more pixels associated with a particular direction show substantial transmission at potassium transition wavelength 769.9 nm, indicating combustion in that direction, even in daylight. The processor 44 then deduces that combustion is occurring at the combustion source 74 location within the surveillance area 72.

Whereas forest fires that persist while an aircraft flies over are relatively easy to detect even with a less wide field of view detector, gun fire or a missile launched at the aircraft is transient, and the odds of detecting either are directly proportional to the surveillance area monitored at one time by the combustion warning system 66. Thus system 66 is especially useful for the detection of gunfire and missile launches before the aircraft is struck, thus warning the aircraft operator in time to take evasive action or engage self-protection systems.

The principles of the compact narrowband imaging system described above can be applied to the airborne surveillance of crop health by measuring the daylight excited fluorescence emissions of the plants that occur at Fraunhofer minimums. The principles can be applied in a similar manner to the LIDAR measurement of cloud formations for meteorology research.

Augmenting the compact narrowband imaging system with a commercially available laser light source matched to the MOF transmission wavelength allows its application to additional fields of use. For example, improved laser communication links between aircraft and ground stations can be realized, Forward Looking InfraRed imaging systems can be improved, and high intensity light generating procedures including many types of welding can be observed with greater contrast.

In summary of the most important advantages, incorporation of the image detector, chiller, preamplifier, digitizer, heat reflective filter, and optical pre-filter within the vacuum chamber reduces the size, weight, power consumption, and cost of a MOF based combustion warning system while enhancing its performance in combustion detection.

The invention has been described above with reference to its specific embodiments. It will, however, be evident to those skilled in the art that various modifications and changes may be made without departing from the broader spirit and scope of the invention. Accordingly, the specification and drawings are to be regarded in an illustrative rather than a restrictive sense and the scope of the invention should be determined only from the ensuing claims properly interpreted in light of the specification and known prior art.

What is claimed is:

1. A narrow band light wave imaging apparatus comprising:
   (1) an evacuated housing comprising means for thermally isolating parts contained in the housing, the housing having an optical entrance window, the parts contained in the housing comprising:
      (a) magneto-optical-filter means for passing an optical bandwidth of light not exceeding approximately 0.01 nanometers,
      (b) light imaging means for receiving light signals transmitted through the magneto-optical filter means and for transmitting electronic signals corresponding to the received light signals out from the housing, and
      (c) heat reflective means disposed before the light imaging means for reducing heat to be received by the light imaging means from the magneto-optical means.

2. An apparatus in accordance with claim 1 where the housing is evacuated to a pressure less than approximately 10 Torr.

3. An apparatus in accordance with claim 1 further comprising magnet means for providing magnetic field required for operation of the magneto-optical filter means and wherein the magnet means are located outside of the housing.

4. An apparatus in accordance with claim 3 wherein the magnet means operate with permanent magnets.

5. An apparatus in accordance with claim 4 wherein the magnet means operate with samarium cobalt permanent magnets.

6. An apparatus in accordance with claim 1 where the magneto-optical-filter means for passing an optical bandwidth of light not exceeding approximately 0.01 nanometers includes an optical wavelength associated with a local minimum in intensity of daylight spectrum and an optical wavelength included in the spectrum of an earthly material or signal.

7. An apparatus in accordance with claim 6 the magneto-optical filter means include a narrowband polarization changing material selected from the group consisting of lithium, sodium, potassium, rubidium, cesium, and calcium.

8. An apparatus in accordance with claim 1 wherein the parts contained in the housing further include heating means for providing elevated temperature required for operation of the magneto-optical filter means.

9. An apparatus in accordance with claim 1 where the light imaging means for transmitting electronic signals corresponding to the received light signals out from the housing transmits in a digital format.

10. An apparatus in accordance with claim 1 wherein the parts contained in the housing further include cooling means for cooling the light imaging means and thereby maintaining it in an operating temperature range.

11. An apparatus in accordance with claim 1 wherein the parts contained in the housing further include an optical pre-filter disposed before the magneto-optical filter means for allowing only a narrow bandwidth of light to enter the magneto-optical filter means, said narrow bandwidth including the optical wavelength associated with a local minimum in intensity of daylight spectrum and an optical wavelength included in the spectrum of the earthly material or signal.

12. An apparatus in accordance with claim 8 where the magneto-optical filter means include a vapor cell including walls optically transparent to light, a first polarizer to give to light that enters the vapor cell a first polarization state, a second polarizer located at a distance from the first polarizer and oriented at 90 degrees relative to the first polarizer to block light having the first polarization state, and vapors of a narrowband polarization changing material that under the magnetic field created by the magnet means rotates light in the bandwidth associated with a local minimum in intensity of daylight spectrum and an optical wavelength included in the spectrum of the earthly material or signal until orthogonal whereby such light travels through the magneto-optical-filter, and where the heating means operate to heat the vapors of the narrowband polarization changing material.

13. An apparatus in accordance with claim 1 further comprising: optical coupling means located outside of the housing for collecting and directing light from a field of view into the optical entrance window of the housing, and image analyzing means located outside of the housing for analyzing the electronic signals received from the light imaging means.

14. A narrow band light wave imaging apparatus comprising:
(1) a housing comprising means for thermally isolating parts contained in the housing, the housing having an optical entrance window, the housing being evacuated to provide means for thermal isolation,
the parts contained in the housing comprising:
(a) a magneto-optical filter for passing a bandwidth of light not exceeding approximately 0.01 nanometers that includes an optical wavelength associated with a local minimum in intensity of daylight spectrum and an optical wavelength included in the spectrum of an earthly material or signal, the magneto-optical filter including a vapor cell including walls transparent to light, a first polarizer to give to light that enters the vapor cell a first polarization state, a second polarizer located at a distance from the first polarizer and oriented at 90 degrees relative to the first polarizer to block light having the first polarization state, and vapors of a narrowband polarization changing material that under the magnetic field created by the magnet means rotates light in the bandwidth associated with a local minimum in intensity of daylight spectrum and an optical wavelength included in the spectrum of the earthly material or signal by 90 degrees whereby such light travels through the vapor cell, said apparatus further including within the housing heating means for heating the vapors of the narrowband polarization changing material,
(b) light imaging means for receiving light signals transmitted through the magneto-optical filter and for transmitting electronic signals corresponding to the received light signals out from the housing,
(2) magnet means located outside of the housing for providing magnetic field required for operation of the magneto-optical filter.

15. An apparatus in accordance with claim 14 wherein the magnet means operate with permanent magnets.

16. An apparatus in accordance with claim 14 wherein the magnet means operate with samarium cobalt permanent magnets.

17. An apparatus in accordance with claim 14 where the housing is evacuated to a pressure less than approximately 10 torr.

18. An apparatus in accordance with claim 14 where the narrowband polarization changing material is potassium and the light transmitted through the magneto-optical filter to be received by the light imaging means is light corresponding to emission lines of potassium and to Fraunhofer lines of the Sun.

19. An apparatus in accordance with claim 14 where the light imaging means transmits by wire out of the evacuated housing the electronic signals corresponding to the light signals received from the magneto-optical filter.

20. An apparatus in accordance with claim 14 wherein the parts contained in the housing further include
(c) an optical pre-filter disposed before the magneto-optical filter for allowing only a narrow bandwidth of light to enter the magneto-optical filter, said narrow bandwidth including the optical wavelength associated with a local minimum in intensity of daylight spectrum and an optical wavelength included in the spectrum of the earthly material or signal,
(d) heating means for providing elevated temperature required for operation of the magneto-optical filter,
(e) cooling means for cooling the light imaging means and thereby maintaining it in an operating temperature range, and
(f) heat reflective means for disposed before the light imaging means for reducing heat to be received by the light imaging means from the magneto-optical filter.

21. An apparatus in accordance with claim 14 further comprising:
optical coupling means located outside of the housing for collecting and directing light from a field of view into the optical entrance window of the housing, and
image analyzing means located outside of the housing for analyzing the electronic signals received from the light imaging means.

22. A narrow band light wave imaging apparatus to be used in a system for observing an area of surveillance for the purpose of detecting combustion of earthly materials containing potassium, the apparatus comprising:
(1) an evacuated housing comprising means for thermally isolating parts contained in the housing, the housing having an optical entrance window forming an optical aperture;
(2) magnet means located outside of the housing for providing a magnetic field; the parts contained in the housing comprising:
(a) magneto-optical-filter means for passing a bandwidth of light not exceeding approximately 0.01 nanometers that includes an optical wavelength associated with a local minimum in intensity of daylight spectrum and an optical wavelength included in the combustion spectrum of earthly materials containing potassium, said magneto-optical filter means including a vapor cell having walls transparent to light, a first polarizer to give to light that enters the vapor cell a first polarization state, a second polarizer located at a distance from the first polarizer and oriented at 90 degrees relative to the first polarizer to block light having the first polarization state, and vapors of potassium that under magnetic field created by the magnet means rotates light in the bandwidth associated with a local minimum in intensity of daylight spectrum and an optical wavelength included in the combustion spectrum of earthly materials containing potassium by 90 degrees whereby such light travels through the vapor cell, the magneto-optical filter means further comprising heating means for keeping potassium in the vapor state, (b) light imaging means for receiving light signals transmitted through the magneto-optical filter means and for transmitting electronic signals corresponding to the received light signals out from the housing, the light imaging means including an image detector, said image detector creating analog signals and a signal digitizer creating digital signals and cooling means for cooling the light imaging means, said digital signals being transmitted out from the evacuated housing;

(c) an optical pre-filter disposed before the magneto-optical filter means for allowing only a narrow bandwidth of light to enter the magneto-optical filter means, said narrow bandwidth including the optical wavelength associated with a local minimum in intensity of daylight spectrum and an optical wavelength included in the combustion spectrum of earthly materials containing potassium, (d) heat reflective means disposed before the light imaging means for reducing heat to be received by the light imaging means from the magneto-optical filter means.

23. An apparatus in accordance with claim 22 wherein the magnet means operate with samarium cobalt permanent magnets.

24. An apparatus in accordance with claim 23 wherein the magnetic field created by the magnet means is in the range of 400 to 1500 Gauss.

25. An apparatus in accordance with claim 22 where the housing is evacuated to a pressure of 10 torr or less.

26. An apparatus in accordance with claim 22 where the magneto-optical filter means include a reservoir for potassium and where the heating means include a heater for heating the reservoir and for heating walls of the vapor cell.

27. An apparatus in accordance with claim 22 where an aspect ratio of the apparatus as defined by the distance between the optical entrance window and a first light receiving surface of the light imaging means, and said distance divided by the length of the optical aperture is less than approximately 4.

28. An apparatus in accordance with claim 22 further comprising:

optical coupling means located outside of the housing for collecting and directing light from a field of view into the optical entrance window of the housing, and image analyzing means located outside of the housing for analyzing the electronic signals received from the light imaging means.

29. A system for observing an area of surveillance for the purpose of detecting combustion of earthly materials containing potassium, the apparatus comprising:

(A) a plurality of narrow band light wave imaging apparatus, said narrow band light wave imaging apparatus comprising:

(1) an evacuated housing comprising means for thermally isolating parts contained in the housing, the housing having an optical entrance window forming an optical aperture;

(2) magnet means located outside of the housing for providing a magnetic field;

the parts contained in the housing comprising:

(a) magneto-optical-filter means for passing a bandwidth of light not exceeding approximately 0.01 nanometers that includes an optical wavelength associated with a local minimum in intensity of daylight spectrum and an optical wavelength included in the combustion spectrum of earthly materials containing potassium, said magneto-optical filter means including a vapor cell having walls transparent to light, a first polarizer to give to light that enters the vapor cell a first polarization state, a second polarizer located at a distance from the first polarizer and oriented at 90 degrees relative to the first polarizer to block light having the first polarization state, and vapors of potassium that under magnetic field created by the magnet means rotates light in the bandwidth associated with a local minimum in intensity of daylight spectrum and an optical wavelength included in the combustion spectrum of earthly materials containing potassium by 90 degrees whereby such light travels through the vapor cell, the magneto-optical filter means further comprising heating means for keeping potassium in the vapor state, (b) light imaging means for receiving light signals transmitted through the magneto-optical filter means and for transmitting electronic signals corresponding to the received light signals out from the housing, the light imaging means including an image detector, said image detector creating analog signals and a signal digitizer creating digital signals and cooling means for cooling the light imaging means, said digital signals being transmitted out from the evacuated housing;

(c) an optical pre-filter disposed before the magneto-optical filter means for allowing only a narrow bandwidth of light to enter the magneto-optical filter means, said narrow bandwidth including the optical wavelength associated with a local minimum in intensity of daylight spectrum and an optical wavelength included in the combustion spectrum of earthly materials containing potassium, (d) heat reflective means disposed before the light imaging means for reducing heat to be received by the light imaging means from the magneto-optical filter means;

each narrow band light wave imaging apparatus further comprising:

(3) optical coupling means located outside of the housing for collecting and directing light from a field of view into the optical entrance window of the housing, and the system further comprising:

(B) image analyzing means for analyzing the electronic signals received from the light imaging means of each narrow band light wave imaging apparatus.

30. A system in accordance with claim 29 wherein the magnet means of each narrow band light wave imaging apparatus operate with permanent magnets.

* * * * *